(12) United States Patent
Yun et al.

(10) Patent No.: US 7,518,210 B2
(45) Date of Patent: Apr. 14, 2009

(54) TRENCH ISOLATED INTEGRATED CIRCUIT DEVICES INCLUDING GROOVES

(75) Inventors: Jae-Sun Yun, Gyeonggi-do (KR); Jin-Hyun Shin, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 439 days.

(21) Appl. No.: 11/046,965

(22) Filed: Jan. 31, 2005

(65) Prior Publication Data
US 2005/0127472 A1 Jun. 16, 2005

Related U.S. Application Data

(62) Division of application No. 10/601,937, filed on Jun. 23, 2003, now Pat. No. 6,939,780.

(30) Foreign Application Priority Data
Oct. 10, 2002 (KR) ............................. 2002-0061720

(51) Int. Cl.
*H01L 29/02* (2006.01)
(52) U.S. Cl. ...................... 257/506; 257/510; 257/544; 257/527
(58) Field of Classification Search ............... 257/76, 257/506, 510, 314, 239, 261, 520, 509, 508, 257/544; 438/404, 424, 425, 437, 594
See application file for complete search history.

(56) References Cited

U.S. PATENT DOCUMENTS 6,093,600 A * 7/2000 Chen et al. .................. 438/243
6,265,302 B1 7/2001 Lim et al.
6,531,377 B2 * 3/2003 Knorr et al. ................. 438/435
6,624,464 B2 9/2003 Shin et al.
6,750,117 B1 6/2004 Hung et al.
6,756,654 B2 * 6/2004 Heo et al. .................... 257/510

FOREIGN PATENT DOCUMENTS

KR  2002-0074716 A  10/2002

OTHER PUBLICATIONS

Notice to File a Response/Amendment to the Examination Report, Korean App. No. 10-2002-0061720, Jul. 19, 2004.

\* cited by examiner

*Primary Examiner*—Chuong Anh Luu
(74) *Attorney, Agent, or Firm*—Myers Bigel Sibley & Sajovec, P.A.

(57) ABSTRACT

Trench isolated integrated circuit devices are fabricated by forming a trench including sidewalls in an integrated circuit substrate, and forming a lower device isolation layer in the trench and extending onto the trench sidewalls. The lower device isolation layer includes grooves therein, a respective one of which extends along a respective one of the sidewalls. An upper device isolation layer is formed on the lower device isolation layer and in the grooves. Trench isolated integrated circuit devices include an integrated circuit substrate including a trench having sidewalls and a lower device isolation layer in the trench and extending onto the trench sidewalls. The lower device isolation layer includes grooves therein, a respective one of which extends along a respective one of the sidewalls. An upper device isolation layer is provided on the lower device isolation layer and in the grooves.

7 Claims, 12 Drawing Sheets

TRENCH ISOLATED INTEGRATED CIRCUIT DEVICES INCLUDING GROOVES

RELATED APPLICATIONS

This application is a divisional of application Ser. No. 10/601,937, filed Jun. 23, 2003 now U.S. Pat. No. 6,939,780, which itself claims the benefit of Korean Patent Application No. 2002-0061720, filed Oct. 10, 2002, both of which are assigned to the assignee of the present application, the disclosures of which are hereby incorporated herein by reference in their entirety as if set forth fully herein.

FIELD OF THE INVENTION

The present invention generally relates to methods of forming integrated circuits, and more specifically to methods of forming trench isolated integrated circuits, and trench isolated integrated circuits so formed.

BACKGROUND OF THE INVENTION

In integrated circuits, a device isolation layer electrically insulates neighboring semiconductor devices such as transistors. As the integrated circuits become more highly integrated, there is a desire to develop insulation technologies that can be used in a small area of an integrated circuit substrate.

Trench isolation has become widely used. A trench device isolation layer may be formed by etching a predetermined region of an integrated circuit substrate such as a semiconductor substrate to a pre-set depth to form a trench. Then, the trench is filled with an insulation layer. The trench device isolation layer can occupy a small area and can have superior insulation characteristics compared to an isolation layer that is formed by conventional local oxidation of silicon (LOCOS).

FIGS. 1 and 2 are cross-sectional views showing methods of forming a conventional trench device isolation layer.

Referring to FIG. 1, a buffer oxide layer 2 and a hard mask layer 3 are sequentially formed on a substrate 1. The hard mask layer 3 and the buffer oxide layer 2 are successively patterned to expose a predetermined region of the substrate 1. The exposed substrate 1 is selectively etched to form a trench 4 having a predetermined depth from top of the substrate 1. A sidewall oxide layer 5 is formed on sidewalls and a bottom (floor) of the trench 4. The buffer oxide layer 2 is formed of silicon oxide and the hard mask layer 3 is formed of silicon nitride. The sidewall oxide layer 5 is formed of thermal oxide.

A conformal liner layer 6 is formed on the surface of the substrate 1 and in the trench 4. A device insulation layer 7 is formed on the liner layer 6 to fill the trench 4. The liner layer 6 is formed of silicon nitride and the device insulation layer 7 is formed of silicon oxide.

Referring now to FIG. 2, the device insulation layer 7 is planarized until the liner layer 6 is exposed, to form a device isolation layer 7a in the trench 4. The exposed liner layer 6 and the hard mask layer 3 are etched by a wet etch process, thereby forming a liner 6a in the trench 4. In this case, a dent 8 may occur at top of sidewalls of the device isolation layer 7a. That is to say, while the liner 6a is formed, edges of the liner 6a are etched by the wet etch process, such that the dent 8 may occur.

The buffer oxide layer 2 is removed to expose the substrate 1 and a gate oxide layer 9 and a gate electrode 10, which are sequentially stacked, are formed on the substrate 1. As shown in FIG. 2, the gate electrode 10 may be formed in the dent 8. Therefore, characteristics of transistors that include the gate electrode 10 can be degraded. For example, a hump or inverse narrow width effect may occur in the transistors.

SUMMARY OF THE INVENTION

Trench isolated integrated circuit devices may be fabricated according to some embodiments of the present invention by forming a trench including sidewalls in an integrated circuit substrate, and forming a lower device isolation layer in the trench and extending onto the trench sidewalls. The lower device isolation layer includes grooves therein, a respective one of which extends along a respective one of the sidewalls. An upper device isolation layer is formed on the lower device isolation layer and in the grooves. In some embodiments, the lower device isolation layer is formed by forming a conformal liner layer on the sidewalls, forming a lower device insulation layer on the conformal liner layer, and etching the conformal liner layer to recess the conformal liner layer relative to the lower device insulation layer adjacent thereto, to thereby define the grooves. In other embodiments, the lower device insulation layer is formed by forming a first insulation layer on the conformal liner layer and a second insulation layer on the first insulation layer. A plurality of transistors may be formed on the trench isolated integrated circuit device.

Trench isolated integrated circuit devices according to other embodiments of the present invention, comprise an integrated circuit substrate including therein a trench having sidewalls and a lower device isolation layer in the trench and extending onto the trench sidewalls. The lower device isolation layer includes grooves therein, a respective one of which extends along a respective one of the sidewalls. An upper device isolation layer is provided on the lower device isolation layer and in the grooves. In some embodiments, the lower device isolation layer comprises a conformal liner layer on the sidewalls and a lower device insulation layer on the conformal liner layer, wherein the conformal liner layer is recessed relative to the lower device insulation layer adjacent thereto, to thereby define the grooves.

Other method embodiments of the present invention form an integrated circuit device by sequentially forming a buffer insulation layer and a hard mask layer on a substrate face. The hard mask layer and the buffer insulation layer are successively patterned to form an opening that exposes a predetermined region of the substrate. The exposed region of the substrate is selectively etched to form a trench including a floor and sidewalls. A lower device isolation layer including grooves is formed within the trench. The grooves are disposed adjacent the sidewalls remote from the floor. An upper device isolation layer is formed on the lower device isolation layer to fill the grooves and the trench. Then, the hard mask layer and the buffer insulation layer are etched such that the grooves extend a predetermined depth from the substrate face.

In some embodiments, a method of forming the lower device isolation layer comprises the following steps: A conformal liner layer is formed on the substrate face and in the trench, and a lower device insulation layer is formed on the liner layer and in the trench. The lower device insulation layer is isotropically etched until the liner layer on sidewalls of the opening is exposed, to form a lower device insulation pattern in the trench. The liner layer is isotropically etched to form a liner in the trench, wherein edges of the liner are recessed a predetermined depth from the substrate face to define the groove. In this case, the liner and the lower device insulation pattern define the lower device isolation layer and the groove is defined by a vacant space surrounded by the liner, the sidewalls of the lower device insulation pattern remote from the floor, and the trench.

Other exemplary embodiments of the present invention are directed to methods of forming an integrated circuit device including a trench device isolation layer that can be applied to a nonvolatile memory device. A tunnel insulation layer, a first floating gate conductive layer, a buffer insulation layer and a hard mask layer are sequentially formed on a substrate. The hard mask layer, the buffer insulation layer, the first floating gate conductive layer and the tunnel insulation layer are successively patterned to form a first floating gate pattern and an opening exposing a predetermined region of the substrate. The exposed region of the substrate is selectively etched to form a trench that defines an active region. A lower device isolation layer is formed in the trench, wherein the lower device isolation layer includes grooves that extend along the sidewalls thereof remote from the floor. An upper device isolation layer is formed on the lower device isolation layer to fill the grooves and the trench. Then, the hard mask layer and the buffer insulation layer are etched until the first floating gate pattern is exposed, such that the grooves have predetermined depth from the substrate face.

DETAILED DESCRIPTION

Figure 1:
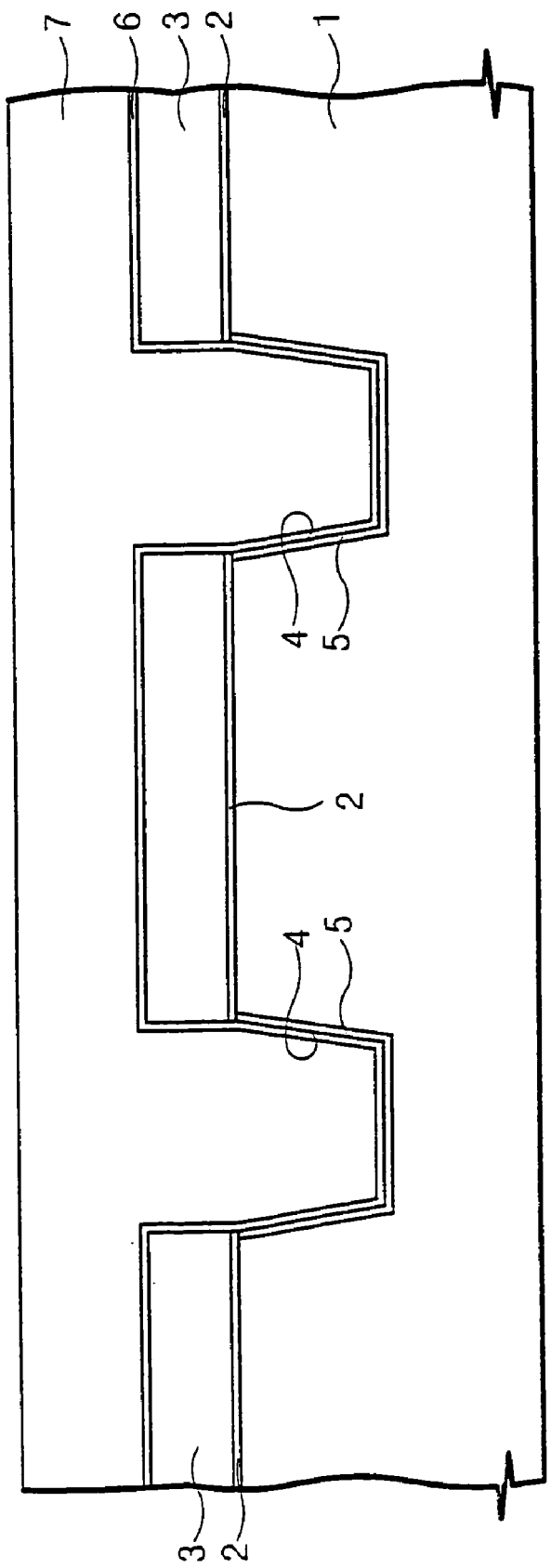
FIGS. 1 and 2 are cross-sectional views showing steps of forming a conventional trench device isolation layer.
Figure 2:
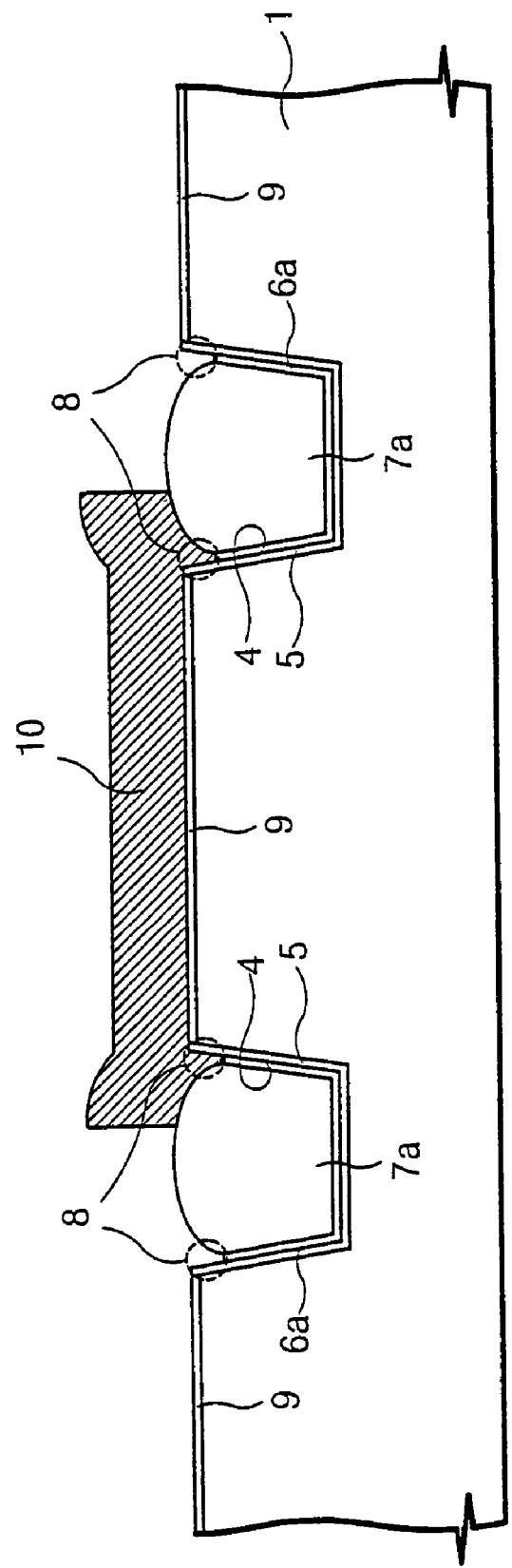

The present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Moreover, each embodiment described and illustrated herein includes its complementary conductivity type embodiment as well. Like numbers refer to like elements throughout.

It will be understood that when an element such as a layer, region or substrate is referred to as being "on" another element, it can be directly on the other element or intervening elements may also be present. It will be understood that if part of an element, such as a surface of a conductive line, is referred to as "outer," it is closer to the outside of the integrated circuit than other parts of the element. Furthermore, relative terms such as "beneath" may be used herein to describe a relationship of one layer or region to another layer or region relative to a substrate or base layer as illustrated in the figures. It will be understood that these terms are intended to encompass different orientations of the device in addition to the orientation depicted in the figures. Thus, for example, the term "lower" is used to signify a layer that is closer to a trench floor than an "upper" layer. Finally, the term "directly" means that there are no intervening elements.

Figure 3A:
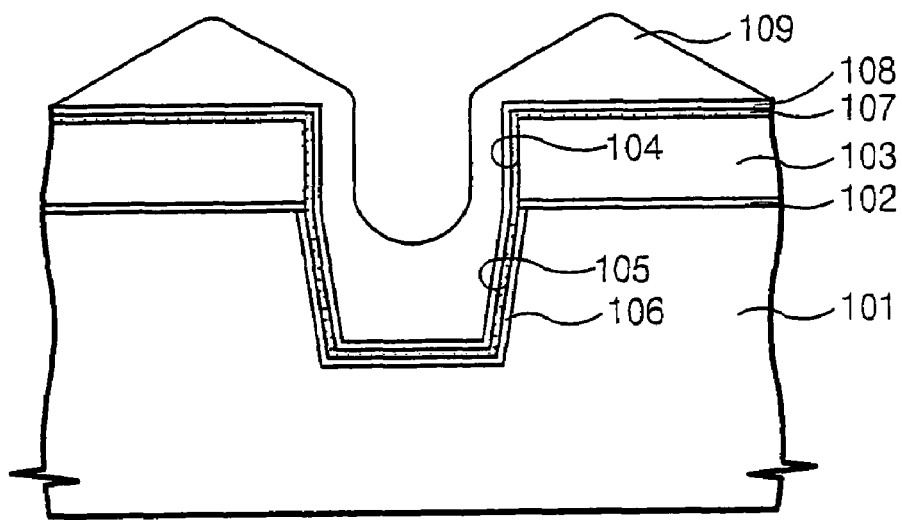
FIGS. 3A, 4A, and 5-8 are cross-sectional views showing steps of forming integrated circuit devices in accordance with embodiments of the present invention.
Figure 3B:
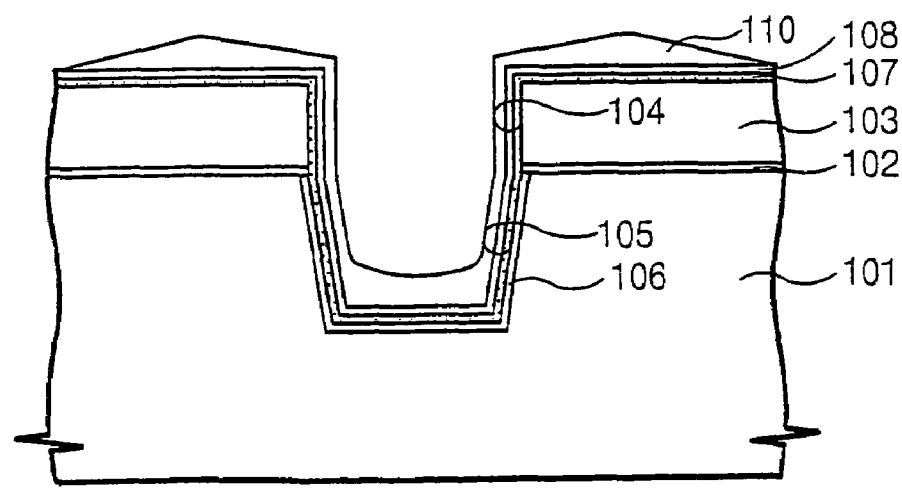
FIGS. 3B and 4B are cross-sectional views showing steps of forming a lower device insulation pattern of integrated circuit devices in accordance with other embodiments of the invention.
Figure 4A:
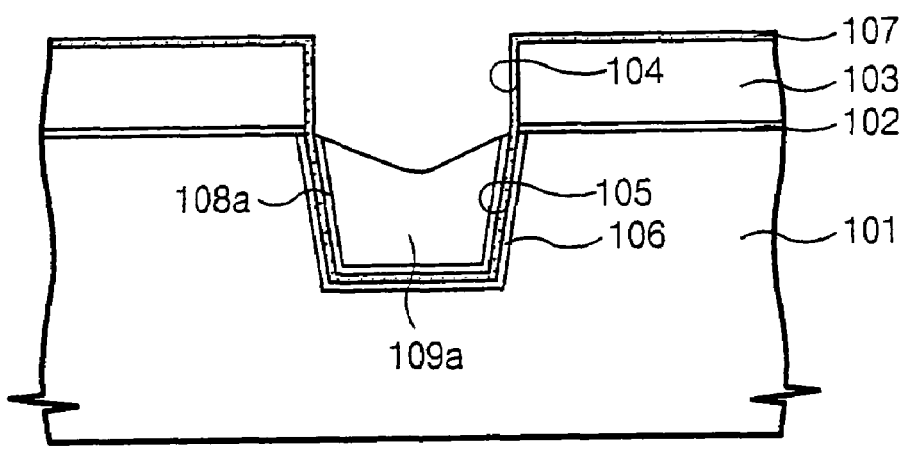
Figure 4B:
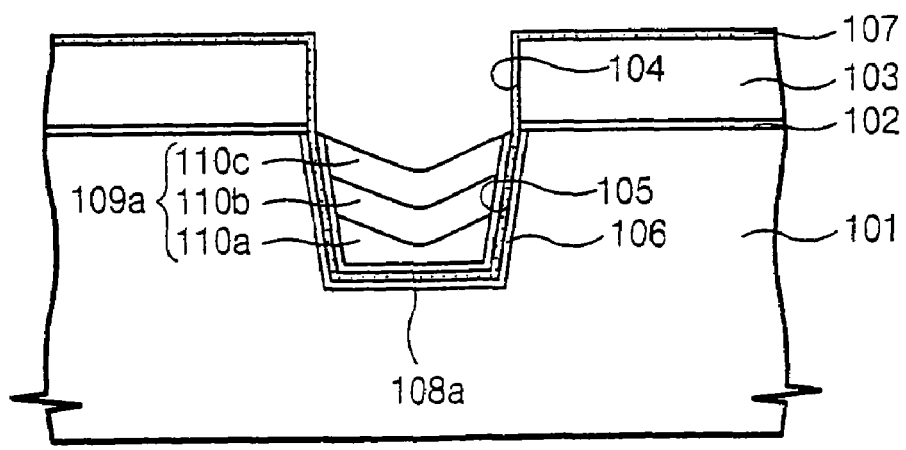

FIGS. 3A, 4A and 5-8 are cross-sectional views showing methods of forming integrated circuit devices in accordance with embodiments of the present invention. FIGS. 3B and 4B are cross-sectional views showing other methods of forming a lower device isolation pattern of integrated circuit devices in accordance with exemplary embodiments of the present invention.

Referring to FIGS. 3A, 4A, 3B, and 4B, a buffer insulation layer 102 and a hard mask layer 103 are sequentially formed on an integrated circuit substrate 101, such as a semiconductor substrate. The buffer insulation layer 102 may be formed of (i.e., comprise) silicon oxide. The hard mask layer 103 may be formed of materials having etch selectivity with respect to the substrate 101, for example, silicon nitride. The hard mask layer 103 and the buffer insulation layer 102 are sequentially patterned to form an opening 104 exposing a predetermined region of the substrate 101. Each sidewall of the opening 104 comprises the hard mask layer 103 and the buffer insulation layer 102. The substrate 101 exposed in the opening 104 is selectively etched to form a trench 105 defining an active region. The trench includes sidewalls and a floor (bottom) therebetween. The sidewalls and/or floor need not be planar but can be curved and/or segmented. After forming the trench 105, a sidewall oxide layer 106 may be formed on the sidewalls and the floor of the trench 105 so as to cure the etched trench 105. The sidewall oxide layer 106 may be formed of thermal oxide and/or thermal oxynitride.

A conformal liner layer 107 is formed on the substrate 101 and on the sidewall oxide layer 106. In exemplary embodiments of the present invention, the liner layer 107 is formed of insulation material having resistance to tension stress, for example, silicon nitride. An etch protection layer 108 and a lower device insulation layer 109 are sequentially formed on the liner layer 107. In exemplary embodiments, the lower device insulation layer 109 is formed of silicon oxide having gap-filling characteristics, for example, high density plasma silicon oxide. The etch protection layer 108 can serve as a protector of the liner layer 107 when the lower device insulation layer 109 is formed of high density plasma silicon oxide. The etch protection layer 108 may be formed of insulation material such as silicon oxide. The etch protection layer 108 may be omitted in some embodiments. The lower device insulation layer 109 may fill a portion of the opening 104.

The lower device insulation layer 109 and the etch protection layer 108 are etched to expose the liner layer 107 on the sidewall of the opening 104 by an isotropic etching process such as a wet etching process. Thus, an etch protection pattern 108a and a lower device insulation pattern 109a, which are sequentially stacked, are formed in the trench 105. An outer surface of the lower device insulation pattern 109a may be lower at a center than at both sides thereof. That is, a portion of the trench 105 may be vacant.

In other embodiments, the lower device insulation pattern 109a may be formed of at least two supplementary insulation patterns 110a-110c that are stacked. These embodiments will be explained with reference to FIGS. 3B and 4B. A supplementary insulation layer 110 is formed on the etch protection layer 108. The supplementary insulation layer 110 fills a portion of the trench 105. The supplementary insulation layer 110 can be formed of silicon oxide having a gap-filling characteristic, for example, high density plasma silicon oxide. The supplementary insulation layer 110 is etched using an isotropic etching process to expose the etch protection layer 108 on the sidewalls of the opening 104, thereby forming a supplementary insulation pattern 110a of a predetermined height from a bottom of the trench 105.

If the supplementary insulation layer 110 and the etch protection layer 108 have the same etch ratio, the supplementary insulation layer can be etched by an etching process to remove the supplementary insulation layer 110 from the sidewalls of the opening 104, thereby forming the supplementary insulation pattern 110a. The supplementary insulation layer 110 and the etch protection layer 108 may be successively etched until the liner layer 107 of the sidewalls of the opening 104 is exposed.

The above steps are applied to the supplementary insulation pattern 110a again, thereby forming another supplementary device insulation pattern 110b. Therefore, the lower device insulation pattern 109a is formed. The lower device insulation pattern 109a may be formed of multi-layered structure where at least the two supplementary insulation patterns 110a-110c are stacked. During a formation of the lower device insulation pattern 110b that is on top of another lower device insulation pattern 110a, the etch protection layer 108 on the sidewalls of the opening 104 may be etched to expose the liner layer 107.

Figure 5:
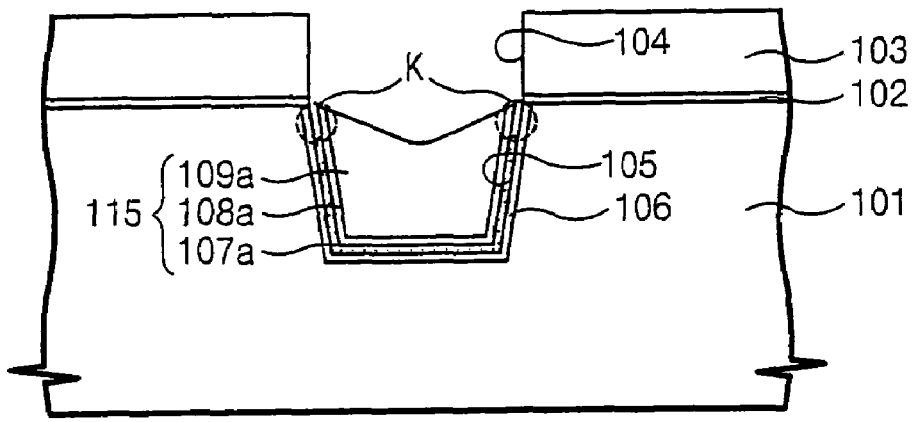
Figure 6:
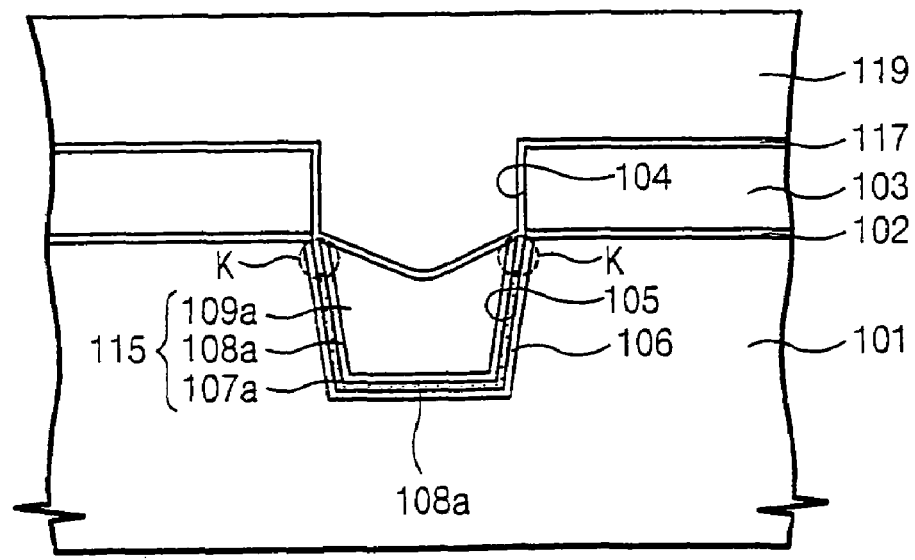

Referring to FIGS. 5 and 6, the exposed liner layer 107 on the inner sidewalls of the opening 104 is isotropically etched to form a liner 107a within the trench 105. In this case, both ends of the liner 107a are recessed from the face of the substrate to a predetermined depth. Thus, grooves K are formed in upper parts of the sidewalls of the lower device insulation pattern 109a remote from the trench floor. It will be understood that as used herein, a groove means a long, narrow region. The groove can have parallel walls. As shown in FIGS. 5 and 6, the grooves K define vacant spaces surrounded by the etch protection pattern 108a neighboring the upper part of the sidewalls of the lower device insulation pattern 109a, the liner 107a, and the upper part of the sidewall of the trench 105. The lower device insulation pattern 109a, the etch protection pattern 108a and the liner 107a define a lower device isolation layer 115. That is, the lower device isolation layer 115 includes the grooves K that extend along the trench sidewalls remote from the trench floor. The groove K recesses the liner 107a relative to the lower device insulation pattern 115 adjacent thereto.

A capping insulation layer 117 may be conformally formed on the substrate 101 including in the grooves K. The capping insulation layer 117 may be formed of insulation material having etch selectivity with respect to the hard mask layer 103, for example, silicon oxide. An upper device insulation layer 119 is formed on the capping insulation layer 117 to fill the trench 105 and the opening 104. The upper device insulation layer 119 is formed of insulation material having etch selectivity with respect to the hard mask layer 103 and gap-filling characteristics, for example, high density plasma silicon oxide. The capping insulation layer 117 protects upper parts of sidewalls of the trench 105 exposed in the groove K during formation of the upper device insulation layer 119 with the high density plasma silicon oxide. In some embodiments, the capping insulation layer 117 need not be formed. If the capping insulation layer 117 is omitted, the upper device insulation layer 119 can fill the grooves K.

Conventionally, when a hard mask layer is removed, a portion of a liner is etched to cause a dent. However, according to some embodiments of the present invention, these problems can be reduced or prevented. That is, the grooves K are formed where the dent could be formed and then the grooves K are filled with the capping insulation layer 117 or the upper device insulation layer 119, such that the dent can be reduced or prevented from occurring during the etching of the hard mask layer 103.

Figure 7:
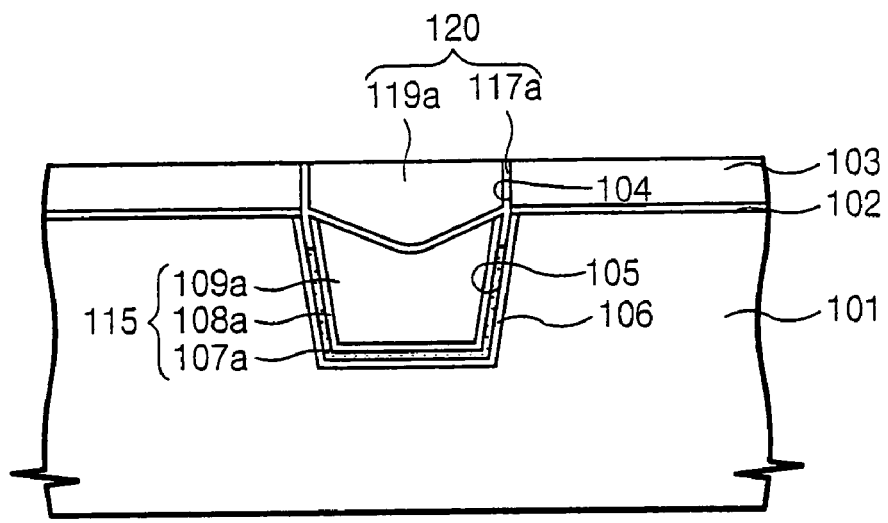
Figure 8:
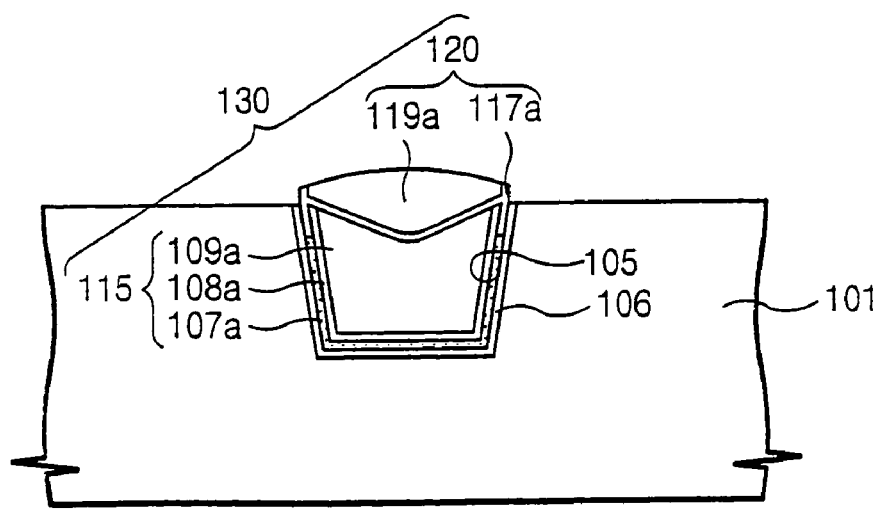

Referring to FIGS. 7 and 8, the upper device insulation layer 119 and the capping insulation layer 117 are planarized until the hard mask layer 103 is exposed. Thus, a capping insulation pattern 117a and an upper device insulation pattern 119a are formed that are sequentially stacked on the lower device isolation layer 115. The capping insulation pattern 117a and the upper device insulation pattern 119a define an upper device isolation layer 120. If the capping insulation pattern 117a is omitted, the upper device isolation layer 120 defines the upper device insulation pattern 119a. The lower device isolation layer 115 and the upper device isolation layer 120 define a trench device isolation layer 130.

The exposed hard mask layer 103 and the buffer insulation layer 102 are etched to expose the face of the substrate 101 and removed. In this case, the upper device isolation layer 120 protects the liner 107a, such that the dent can be reduced or prevented.

In other exemplary embodiments of the present invention, methods are provided for forming a nonvolatile memory device including a trench device isolation layer. A nonvolatile memory device may comprise a floating gate electrode and a control gate electrode. The floating gate electrode stores electrons and the control gate electrode controls programming, erasing, and selecting operations. In these other exemplary embodiments, the floating gate electrode and a trench are formed using self-alignment techniques.

Figure 15:
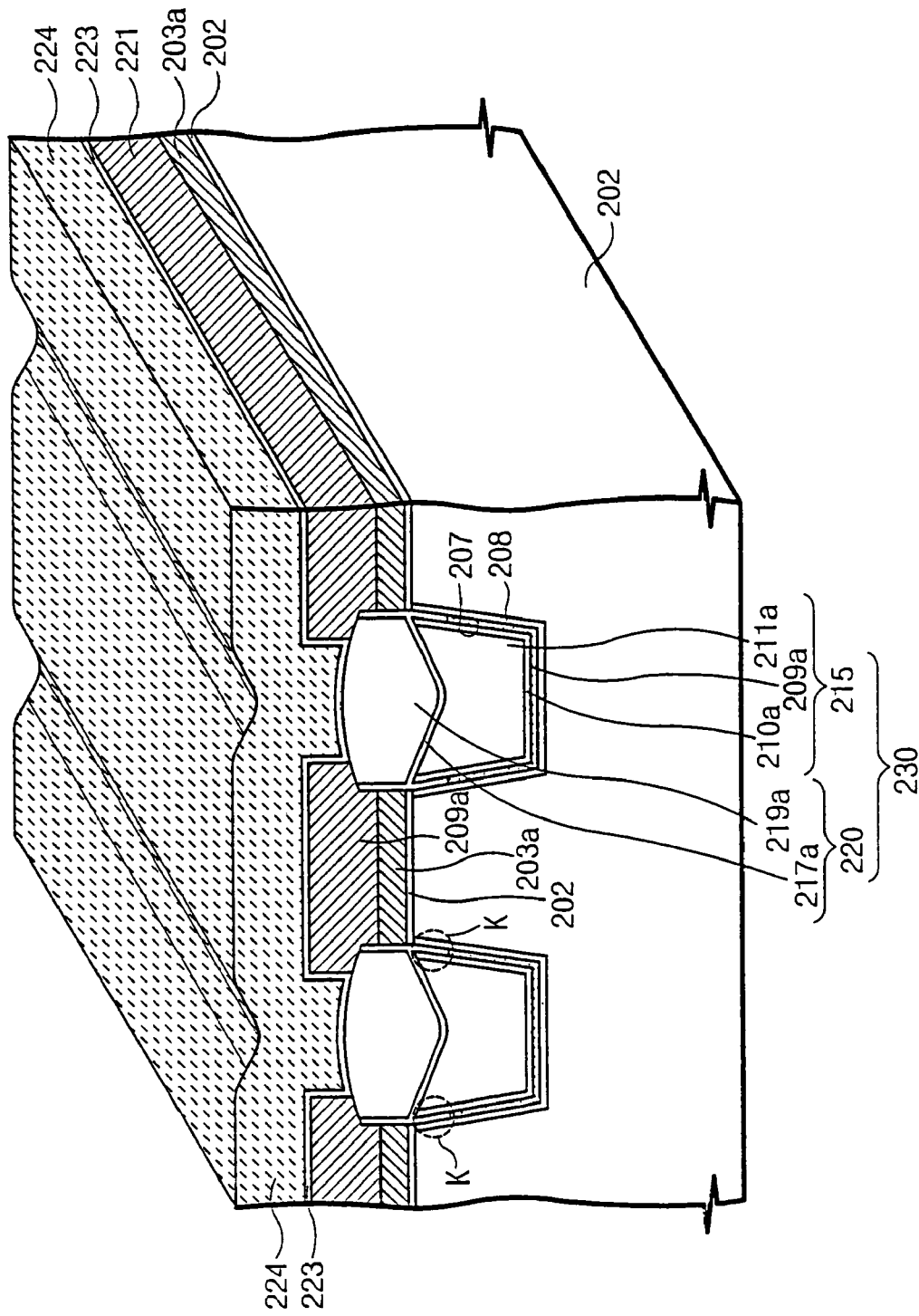
FIGS. 15 and 16 are perspective views showing steps of forming gate electrodes in accordance with embodiments of the invention.
Figure 16:
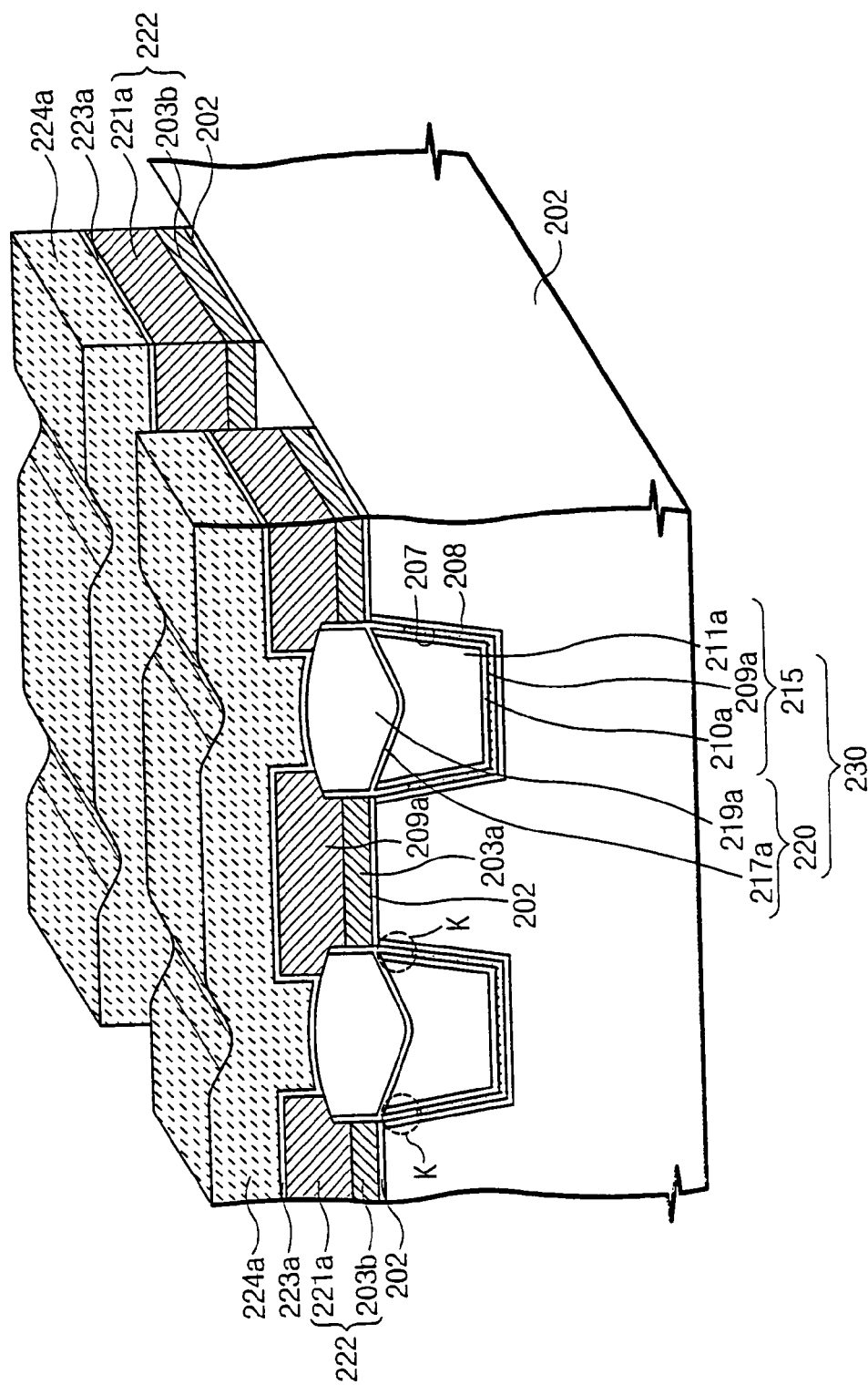

FIGS. 9, 10, 11A, 12A, 13 and 14 are cross-sectional views showing methods of forming an integrated circuit device in accordance with these other exemplary embodiments. FIG. 11B is a cross-sectional view showing other methods of forming a lower device insulation pattern of integrated circuit devices in accordance with these other exemplary embodiments of the present invention. FIG. 12B is a cross-sectional view of an etch buffer layer in accordance with these other exemplary embodiments of the present invention. FIGS. 15 and 16 are perspective views showing methods of forming gate electrodes in accordance with exemplary embodiments of the present invention.

Figure 9:
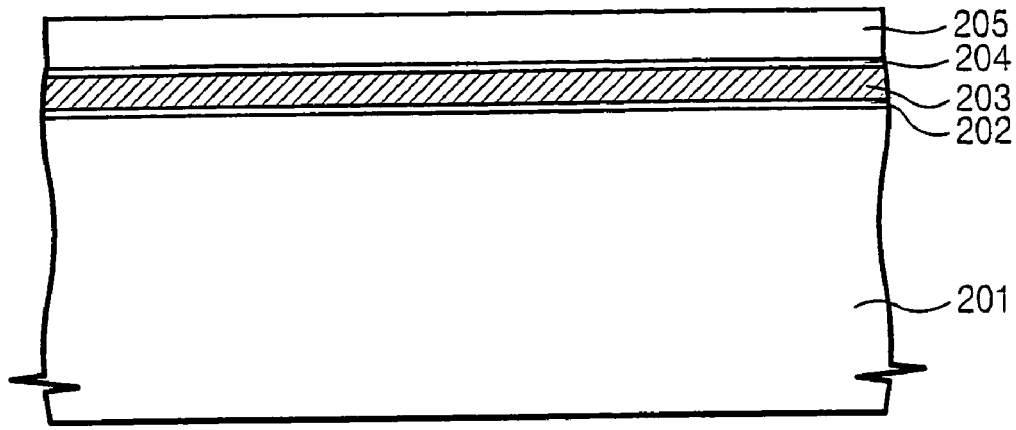
FIGS. 9, 10, 11A, 12A, 13, and 14 are cross-sectional views showing steps of forming integrated circuit devices in accordance with yet other embodiments of the invention.
Figure 10:
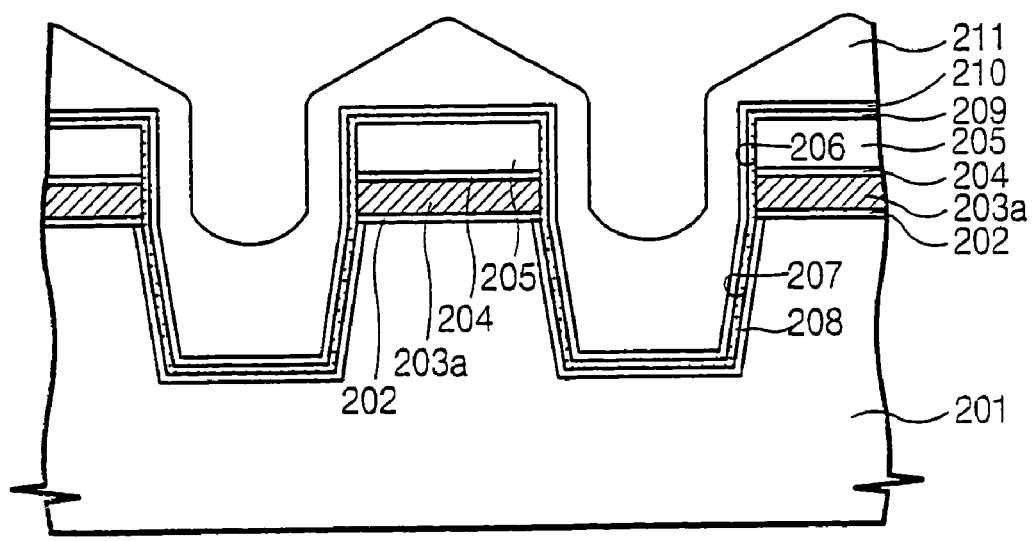

Referring to FIGS. 9 and 10, a tunnel insulation layer 202, a first floating gate conductive layer 203, a buffer insulation layer 204, and a hard mask layer 205 are sequentially formed on an integrated circuit substrate 201 such as a semiconductor substrate. The tunnel insulation layer 202 may be formed of thermal oxide or thermal oxynitride. The first floating gate conductive layer 203 may be formed of conductive material, for example, doped polysilicon. The buffer insulation layer 204 may be formed of CVD silicon oxide. The buffer insulation layer 204 may be omitted in some embodiments. The hard mask layer 205 may be formed of materials having etch selectivity with respect to the substrate 201, for example, silicon nitride.

The hard mask layer 205, the buffer insulation layer 204, the first floating gate conductive layer 203, and the tunnel insulation layer 202 are successively patterned to form an opening 206 exposing a predetermined region of the substrate 201. In this case, the first floating gate conductive layer 203 is formed of first floating gate pattern 203a. Sidewalls of the opening 206 are formed of the hard mask layer 205, the buffer insulation layer 204, the first floating gate pattern 203a, and the tunnel insulation layer 202. The substrate 201 exposed in the opening 206 is selectively etched to form a trench 207 that defines an active region. The trench includes a floor and sidewalls as was described above. In this case, the first floating gate pattern 203a is self-aligned to the trench 207. That is, the first floating gate pattern 203a is disposed over the active region.

A sidewall oxide layer 208 is formed on the sidewalls and floor of the trench 207 that was etched. The sidewall oxide layer 208 can cure the sidewalls and the bottom of the trench 207 that may be damaged by the etching. A conformal liner layer 209 is formed on the substrate 201 with the sidewall oxide layer 208. The liner layer 209 may be formed of insulation material having resistance to tension, for example, silicon nitride. An etch protection layer 210 and a lower device insulation layer 211 are sequentially formed on the liner layer 209. In exemplary embodiments, the lower device insulation layer 211 is formed of silicon oxide having gap-filling characteristics, for example, high density plasma silicon oxide. When the lower device insulation layer 211 is formed of the high density plasma silicon oxide, the etch protection layer 210 can reduce or prevent damage to the liner layer 209. The etch protection layer 210 may be formed of insulation material, for example, CVD silicon oxide. In other embodiments, the etch protection layer 210 may not be used. The lower device insulation layer 211 may fill the trench 207 and a portion of the opening 206.

Figure 11A:
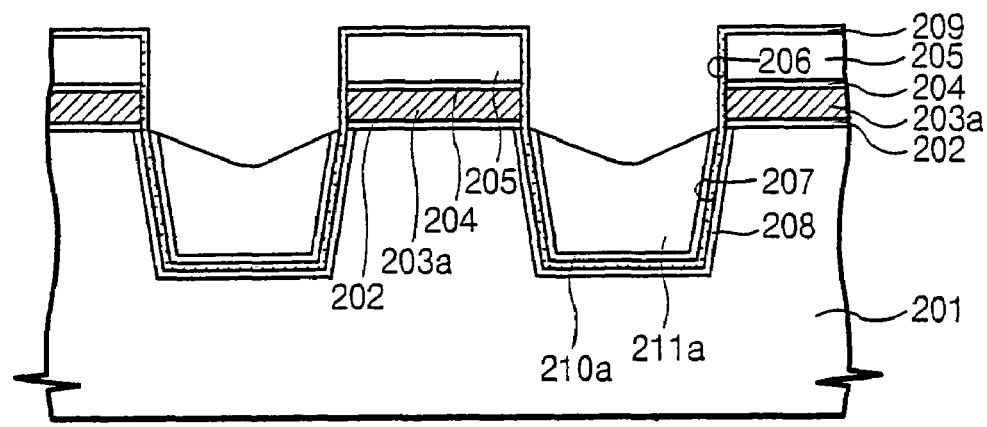
Figure 11B:
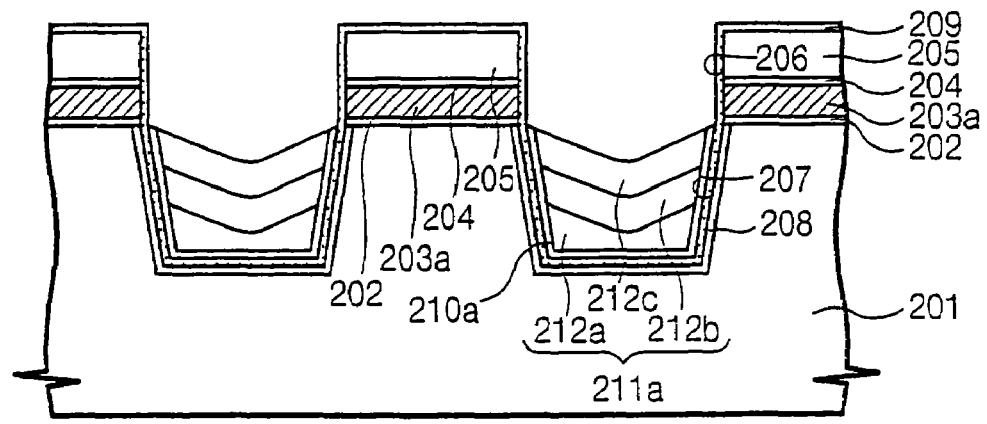
FIG. 11B is a cross-sectional view showing steps of forming a lower device insulation pattern of integrated circuit devices in accordance with still other embodiments of the invention.

Referring to FIGS. 11A and 11B, the lower device insulation layer 211 and the etch protection layer 210 are isotropically etched using, for example, a wet etching process to expose the liner layer 209 on sidewalls of the opening 206. Therefore, an etch protection pattern 210a and a lower device insulation pattern 211a are formed that are sequentially stacked in the trench 207. Both edges of the top of the lower insulation pattern 211a may be of same height as the face of the substrate 201. In other embodiments, both edges of the top of the lower insulation pattern 211a may be recessed beneath the face of the substrate 201.

Using other methods, as illustrated in FIG. 11B, the lower device insulation pattern may comprise at least two supplementary insulation patterns 212a-212c that are stacked. The supplementary insulation patterns 212a-212c can be formed using the same methods as forming the supplementary insulation layer 110 and the supplementary patterns 110a-110c illustrated in FIGS. 3B and 4B.

Figure 12A:
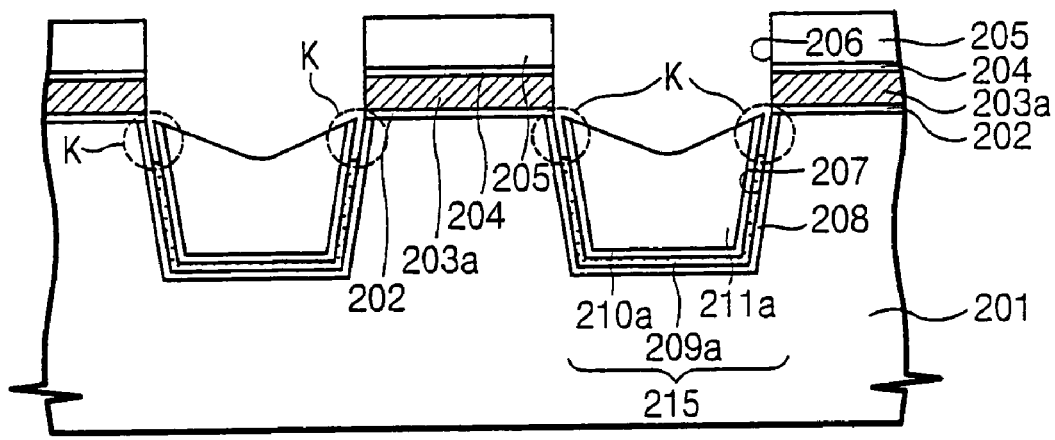
Figure 12B:
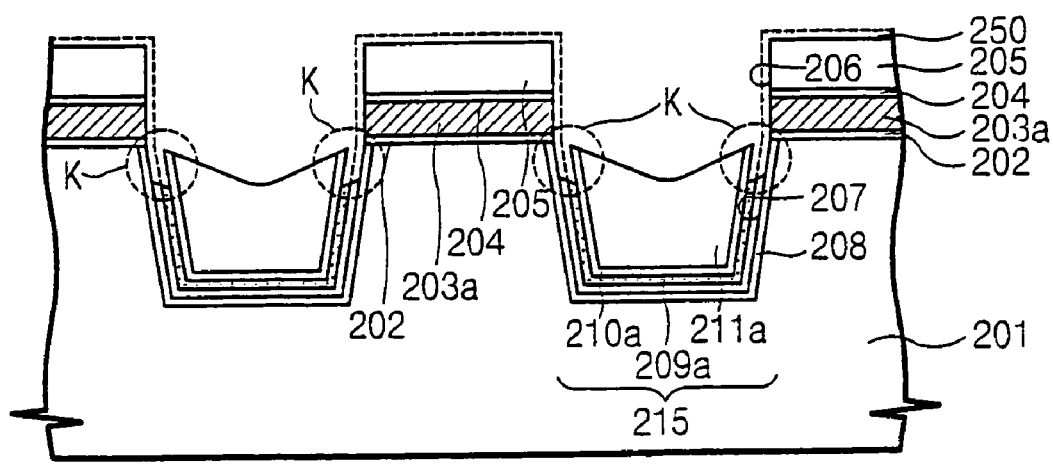
FIG. 12B is a cross-sectional view showing an etch buffer layer of integrated circuit devices in accordance with embodiments of the invention.

Referring to FIGS. 12A and 12B, the liner layer 209 on sidewalls of the opening 206 is etched by, for example, a wet etching process, thereby forming a liner 209a in the trench 207. Both edges of the liner 209a are recessed from the face of the substrate 201 to a predetermined depth by the isotropic etching. That is, there formed grooves K, as described above, which are surrounded by the etch protection pattern 210a neighboring an upper part of the sidewall of the lower device insulation pattern 211a, the liner 209a, and an upper part of the sidewalls of the trench 207. The liner 209a, the etch protection pattern 210a, and the lower device insulation pattern 211a define a lower device isolation layer 215. That is, the lower device isolation layer 215 includes the grooves K that extend along both trench sidewalls, remote from the trench floor.

Before forming the liner layer 209, an etch buffer layer 250 may be formed. The etch buffer layer 250 is conformally formed on the substrate 201 an on the sidewall oxide 208. In this case, both sidewalls of the first floating gate pattern 203a and the tunnel insulation layer 202 are protected by the etch buffer layer 250. When the liner layer 209 is etched by the wet etch process to form the liner 209a, the etch buffer layer 250 protects sidewalls of the tunnel insulation layer 202 and first floating gate pattern 203a. The etch buffer layer 250 may be formed of CVD silicon oxide. The dotted line of FIG. 12B shows a part of the etch buffer layer 250 that can be removed while the liner 209a is formed. A bottom of the groove K may comprise the etch buffer layer 250 and the liner 209a. The etch buffer layer 250 may be removed.

Figure 13:
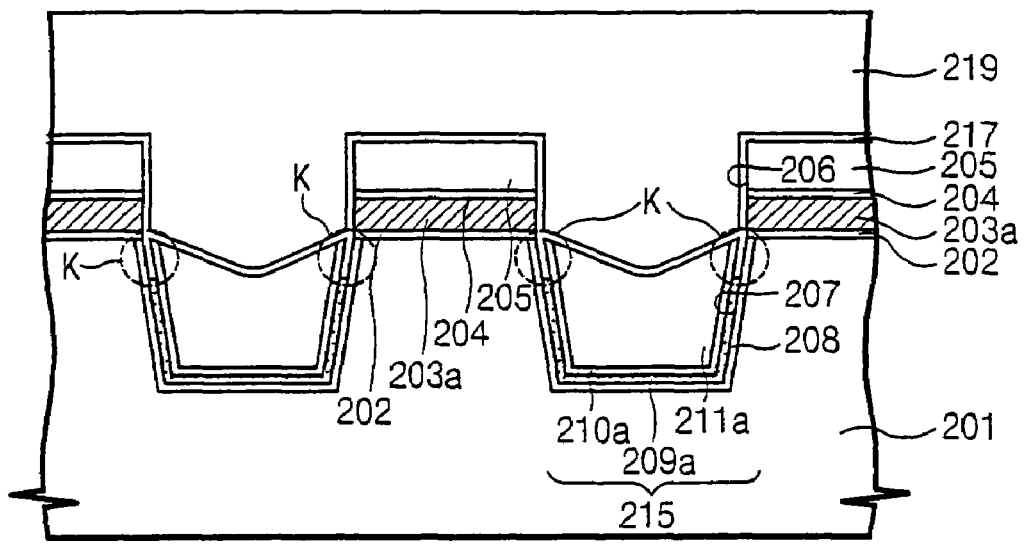
Figure 14:
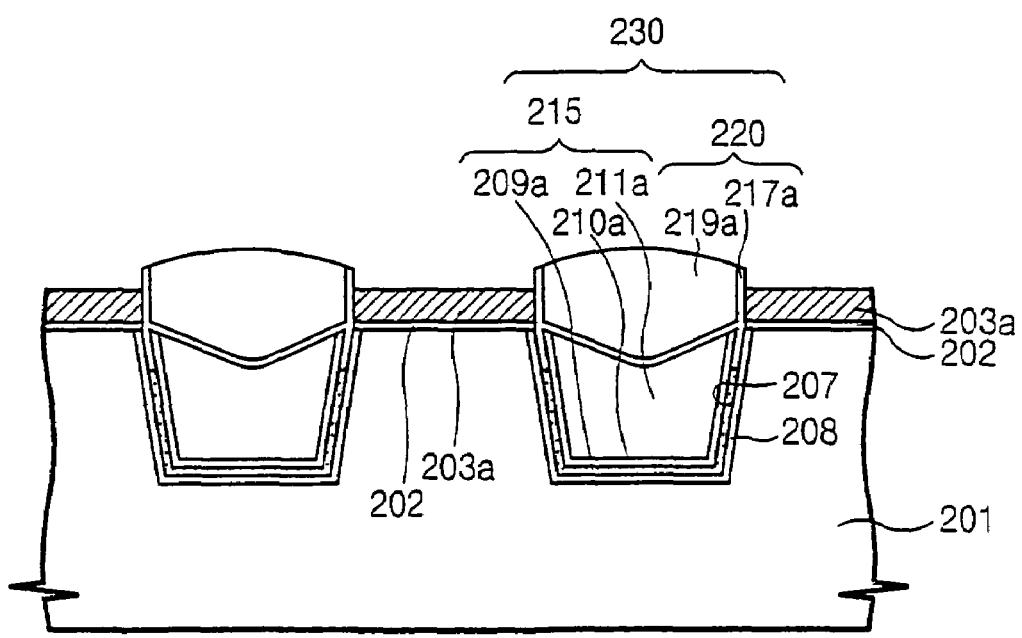

Referring to FIGS. 13 and 14, a capping insulation layer 217 is conformally formed on the substrate 201 to fill the groove K. Then, an upper insulation layer 219 is formed on the capping insulation layer 217 to fill the trench 207 and the opening 206. The capping insulation layer 217 is formed of insulation material such as silicon oxide that has etch selectivity with respect to the hard mask layer 205. In exemplary embodiments, the upper device insulation layer 219 is formed of insulation material such as high plasma silicon oxide that has etch selectivity with respect to the hard mask layer 205. When the upper device insulation layer 219 is formed of high density plasma silicon oxide, the capping insulation layer 217 protects the upper part of the sidewalls of the trench 207 exposed in the grooves K. As was described above, the capping insulation layer 217 need not be formed. In this case, the upper device insulation layer 219 can fill the grooves K.

The upper device insulation layer 219 and the capping insulation layer 217 are planarized to expose the hard mask layer 205, thereby forming an upper device isolation layer 220 comprising a capping insulation pattern 217a and an upper device insulation pattern 219a that are stacked on the lower device isolation layer 115. If the capping insulation pattern 217a is not formed, the upper device isolation layer 220 defines the device insulation pattern 219a. The lower device isolation layer 215 and the upper device isolation layer 220 define a trench device isolation layer 230.

The exposed hard mask layer 205 and the buffer insulation layer 204 are etched until the first floating gate pattern 203a is exposed. In this case, the liner 209a is covered with the upper device isolation layer 220, such that a dent can be reduced or prevented compared to a conventional method that causes the liner to be etched. In other words, before removing the hard mask layer 205, the liner layer 209a is etched to form the groove K and then the groove K is filled with the upper device isolation layer 220 having etch selectivity with respect to the hard mask layer 205. Therefore, the dent problem can be reduced or eliminated.

Referring to FIGS. 14 and 15, methods of forming gate electrodes of nonvolatile memory devices in accordance with other exemplary embodiments of the present invention are illustrated.

Referring to FIGS. 14 and 15, a second floating gate conductive layer (not shown) is formed on the substrate 201 including on the exposed first floating gate pattern 203a of FIG. 13. Then, the second floating gate conductive layer is patterned to form a second floating gate pattern 221 on the first floating gate pattern 203a. The second floating gate pattern 221 may be formed of conductive material such as doped polysilicon. A dielectric layer 223 and a control gate conductive layer 224 are sequentially formed on the substrate 201 and on the second floating gate pattern 221. The dielectric layer 223 may be formed of ONO ($SiO_2$—SiN—$SiO_2$). The control gate conductive layer 224 is formed of conductive material, for example, doped polysilicon or polycide. The polycide comprises doped polysilicon and metal silicide layer that are stacked.

The control gate conductive layer 224, the dielectric layer 223, the second floating gate pattern 221, and the first floating gate pattern 203a are successively patterned to form a first floating gate electrode 203b, a second floating gate electrode 221a, a dielectric pattern 223a and a control gate electrode 224a that are stacked. The first and second floating gate electrodes 203b and 221a are self-aligned to the control gate electrode 224a. The first and second floating gate electrodes 203b and 221a compose a floating gate electrode 222. The floating gate electrode 222 is electrically isolated. The control gate electrode 224a crosses over the active region.

According to some embodiments of the present invention, before removing the hard mask layer, a lower device isolation layer is formed that includes grooves in upper parts of the sidewalls thereof. The grooves are filled with the upper device isolation layer having etch selectivity with respect to the hard mask layer so as not to expose the liner. Therefore, when the hard mask layer is removed, a dent that results from damages to the liner can be reduced or prevented. Accordingly, the deterioration of transistor characteristics can be reduced or prevented.

In the drawings and specification, there have been disclosed embodiments of the invention and, although specific terms are employed, they are used in a generic and descriptive sense only and not for purposes of limitation, the scope of the invention being set forth in the following claims.

What is claimed is:

1. A trench isolated integrated circuit device comprising:
    an integrated circuit substrate including therein a trench having sidewalls;
    a lower device isolation layer in the trench and extending onto the trench sidewalls, the lower device isolation layer including long, narrow grooves therein, a respective one of which extends along a respective one of the sidewalls, such that a respective groove spaces apart the lower device isolation layer adjacent thereto, from a respective sidewall; and
    an upper device isolation layer on the lower device isolation layer and in the grooves.

2. A device according to claim 1 wherein the lower device isolation layer comprises:
    a conformal liner layer on the sidewalls; and
    a lower device insulation layer on the conformal liner layer;
    wherein the conformal liner layer is recessed relative to the lower device insulation layer adjacent thereto, to thereby define the long, narrow grooves that space apart the lower device isolation layer adjacent thereto, from the respective sidewall.

3. A device according to claim 2 wherein the lower device insulation layer comprises:
    a first insulation layer on the conformal liner layer; and
    a second insulation layer on the first insulation layer.

4. A device according to claim 1 further comprising;
    a plurality of transistors on the integrated circuit substrate.

5. A device according to claim 1 further comprising:
    a sidewall oxide layer disposed on the sidewalls and floor of the trench;
    wherein the lower device isolation layer is disposed on the sidewall oxide layer.

6. A device according to claim 1 wherein the upper device isolation layer comprises:
    a capping insulation layer on the lower device isolation layer; and
    an upper insulation pattern on the capping insulating layer;
    wherein the capping insulation layer extends in the groove.

7. A device according to claim 6 wherein the capping insulation layer extends to cover at least a portion of the sidewalls of the upper insulation pattern.

* * * * *